United States Patent
Chen (10) Patent No.: US 7,255,801 B2
(45) Date of Patent: Aug. 14, 2007

(54) DEEP SUBMICRON CMOS COMPATIBLE SUSPENDING INDUCTOR

(75) Inventor: Chung-Hui Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 10/820,396

(22) Filed: Apr. 8, 2004

(65) Prior Publication Data

US 2005/0225420 A1 Oct. 13, 2005

(51) Int. Cl.
*H01L 21/302* (2006.01)

(52) U.S. Cl. ............... 216/13; 216/17; 216/18; 216/39; 216/41; 216/51; 216/83; 216/99; 438/689; 438/394; 438/700; 438/701; 438/745; 438/756

(58) Field of Classification Search .............. None
See application file for complete search history.

(56) References Cited

U.S. PATENT DOCUMENTS

| | | | |
|---|---|---|---|
| 5,539,241 A * | 7/1996 | Abidi et al. ............... 257/531 |
| 5,798,557 A | 8/1998 | Salatino et al. |
| 6,140,197 A | 10/2000 | Chu et al. |
| 6,180,995 B1 * | 1/2001 | Hebert ..................... 257/531 |
| 6,211,056 B1 * | 4/2001 | Begley et al. ............ 438/619 |
| 6,249,206 B1 | 6/2001 | Uchikoba et al. |
| 6,258,652 B1 | 7/2001 | Stacey |
| 6,274,920 B1 | 8/2001 | Park et al. |
| 6,693,039 B2 * | 2/2004 | Erratico et al. ............ 438/700 |
| 2002/0109204 A1 * | 8/2002 | Acosta et al. .............. 257/531 |
| 2002/0148807 A1 * | 10/2002 | Zhao et al. .................. 216/2 |
| 2003/0010746 A1 * | 1/2003 | Gutierrez et al. ............ 216/2 |
| 2005/0014317 A1 * | 1/2005 | Pyo ........................... 438/184 |
| 2005/0093668 A1 * | 5/2005 | Bueyuektas et al. ....... 336/200 |
| 2006/0017539 A1 * | 1/2006 | Lee et al. ................... 336/200 |

FOREIGN PATENT DOCUMENTS

WO WO 03081616 A1 * 10/2003

* cited by examiner

*Primary Examiner*—Anita Alanko
(74) *Attorney, Agent, or Firm*—Haynes and Boone, LLP

(57) ABSTRACT

A new method is provided for the creation of an inductor. Layers of pad oxide, a thick layer of dielectric and an etch stop layer are successively created over the surface of a substrate. The layers of etch stop material and dielectric are patterned and etched, creating an inductor pattern whereby the inductor pattern created in the layer of dielectric is located close to the surface of the layer of dielectric. Optionally, support pillars for the inductor can be created at this time through the layer of dielectric. The inductor pattern in the layer of dielectric is filled with metal, the etch stop layer and the layer of dielectric is removed from above the metal fill, additionally exposing the layer of dielectric. The additionally exposed layer of dielectric is etched using a slope etcher. Since the layer of dielectric is preferably an oxide based layer of dielectric, this exposure will significantly remove the layer of dielectric, creating an air gap surrounding the inductor without affecting the optionally created support pillars or the created inductor.

18 Claims, 4 Drawing Sheets

DEEP SUBMICRON CMOS COMPATIBLE SUSPENDING INDUCTOR

BACKGROUND OF THE INVENTION (1) Field of the Invention

The invention relates to the fabrication of integrated circuit devices, and more particularly, to a method for the creation of a CMOS compatible suspended inductor.

(2) Description of the Prior Art

Integrated Circuit (IC) devices are typically formed over the surface of a semiconductor substrate, electrical circuit elements of the individual IC devices are connected internally to the semiconductor surface on which the IC devices are formed. IC devices that are formed in or on the surface of a substrate are typically active digital processing devices or, less typically, analog processing devices. In addition, discrete passive components can be formed that function with created active semiconductor devices, these discrete passive components are preferably formed using existing semiconductor device technology techniques and equipment.

Semiconductor device performance improvements are largely achieved by reducing device dimensions. This trend of device miniaturization has progressed to where modern day devices are created with sub-micron and deep sub-micron device feature size. While this process has been a continuing trend for active semiconductor devices it has placed increased emphasis on miniaturization of discrete passive components, such as inductors, that are required to function with the miniaturized active devices. To accommodate the requirements that arise from the continuing reductions of the dimensions of discrete passive components, the methods used and the design of passive components continue to be modified and adapted while concurrently materials and their application are explored that provide improved performance of the discrete components.

Typical application for the inductor of the invention is in the field of modern mobile communication applications that make use of compact high-frequency equipment. This equipment has over the years continually improved in its performance characteristics, further improvements place continued emphasis on lowering the power consumption of the equipment, on reducing the size of the equipment, on increasing the operational frequency of the applications and on creating low noise levels. One of the main applications of semiconductor devices in the field of mobile communication is the creation of Radio Frequency (RF) amplifiers. RF amplifiers contain a number of standard components whereby however a major component of a typical RF amplifier is a tuned circuit that contains inductive and capacitive components. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate.

The invention addresses the creation of a high-Q on-chip inductor with the objective of improving the performance characteristics of a conventionally created on-chip spiral inductor. The suspended inductor of the invention uses an air-gap and is supported by a set of novel metal pillars, in this manner suppressing the parasitic capacitance experienced between the metal layer of the inductor and the underlying substrate. The quality factor of the created inductor of the invention is improved from a Q-value of a conventional inductor of 4.8 to a value of 6.3 for the inductor of the invention. In addition, the frequency at which this Q maximum value of the inductor can be achieved has been increased from 1.5 GHz to 2.0 GHz.

U.S. Pat. No. 6,140,197 (Chu et al.) shows an inductor design with air gaps in the dielectric layer under the inductor.

U.S. Pat. No. 6,211,056 B1 (Begley et al.) shows an air bridge under an inductor.

U.S. Pat. No. 5,798,557 (Salatino et al.) shows suspended conductors.

U.S. Pat. No. 6,274,920 B1 (Park et al.), U.S. Pat. No. 6,249,206 B1 (Uchikoba et al.), U.S. Pat. No. 6,180,995 B1 (Herbert) and U.S. Pat. No. 6,258,652 B2 (Stacey) are related inductor and air gap patents.

T. Ueda, E. Tamaoka, K. Yamashita, N. Aoi and S. Mayumi: 'A Novel Air Gap Integration Scheme for Multi-level Interconnects using Self-aligned Via Plugs', Symposium on VLSI Tech. Dig. of Tech. Papers, p. 46-47, 1998.

Ali M. Niknejad, and Robert G Meyer: 'Analysis, Design, and Optimization of Spiral Inductors and Transformers for Si RF IC's', IEEE Journal of Solid-State Circuits, Vol. 33, No. 10, October 1998, p. 1470.

Kirk B. Ashby, A. Koullias, William C. Finley, John J. Bastek, and Moinian: 'High Q Inductors for Wireless Applications in a Complementary Silicon Bipolar Process', IEEE Journal of Solid-State Circuits, Vol. 31, No. 1, January 1996, p. 4.

Min Park, Seonghearn Lee, Cheon Soo Kim, Hyun Kyu Yu, and Kee Soo Nam: 'The Detailed Analysis of High CMOS-Compatible Microwave Spiral Inductors in Silicon Technology', IEEE TRANSACTIONS ON ELECTRON DEVICES, VOL. 45, NO. 9, SEPTEMBER 1998.

SUMMARY OF THE INVENTION

A principle objective of the invention is to create a high-Q, on-chip inductor.

Another objective of the invention is to increase the frequency at which a high-Q inductor can be applied.

Yet another objective of the invention is to create an inductor over the surface of a substrate having increased separation between the inductor and the substrate.

A still further objective of the invention is to provide a method for the creation of a suspended inductor, the suspension of the inductor being created by providing novel metal pillars for the creation of the inductor thereover.

In accordance with the objectives of the invention a new method is provided for the creation of an inductor. Layers of pad oxide, a thick layer of dielectric and an etch stop layer are successively created over the surface of a substrate. The layers of etch stop material and dielectric are patterned and etched, creating an inductor pattern whereby the inductor pattern created in the layer of dielectric is located close to the surface of the layer of dielectric. Optionally, support pillars for the inductor can be created at this time through the layer of dielectric. The inductor pattern in the layer of dielectric is filled with metal, the etch stop layer and the layer of dielectric is removed from above the metal fill, additionally exposing the layer of dielectric. The additionally exposed layer of dielectric is etched using a slope etcher. Since the layer of dielectric is preferably an oxide based layer of dielectric, this exposure will significantly remove the layer of dielectric, creating an air gap surrounding the inductor without affecting the optionally created support pillars.

DESCRIPTION OF THE PREFERRED EMBODIMENTS

An inductor is, as has previously been pointed out, one of the important components that are used for the creation of high-frequency analog semiconductor devices, whereby the inductor typically is part of a LC resonance circuit. The inductor must be created while using a minimum of the surface area of the substrate without thereby sacrificing the high-Q value of the created inductor. Typically, inductors that are created on the surface of a substrate are of a spiral shape, whereby the spiral is created in a plane that is parallel with the plane of the surface of the substrate. Conventional methods that are used to create an inductor over the surface of a semiconductor substrate suffer several limitations such as applying methods that are not readily integratable into a typical process of Integrated Circuit manufacturing foundry.

It is clear that by combining the creation of analog circuitry with the creation of digital circuitry a number of significant advantages can be achieved. Such advantages include the reduction of manufacturing costs and the reduction of power consumption by the combined functions. To reach required inductive values for particular applications, inductors may be required to be of significant physical size and will therefore require a significant surface area over the surface of the semiconductor substrate. To limit this impact of space requirement, inductors are typically formed on the surface of a substrate in a spiral form. The spiral form of the inductor however results in parasitic capacitances between the inductor wiring and the underlying substrate, due to the physical size of the inductor. These parasitic capacitances have a serious negative effect on the functionality of the created LC circuit by sharply reducing the frequency of resonance of the tuned circuit of the application.

The parameter by which the applicability of an inductor is typically reflected is the Quality (Q) factor of the inductor. The quality factor Q of an inductor is defined as $Q=Es/El$, wherein Es is the energy that is stored in the reactive portion of the component while El is the energy that is lost in the reactive portion of the component. The higher the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component, which can be degraded due to parasitics. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit to about 10 the quality factor that can be achieved for the inductor using the conventional silicon process. This limitation is, for many applications, not acceptable. Dependent on the frequency at which the LC circuit is designed to resonate, significantly larger values of the quality factor, such as for instance 100 or more, must be available. Prior Art has in this been limited to creating values of higher quality factors as separate units and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like.

Wireless communications is a rapidly expanding market, where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

A number of different approaches have been use to incorporate inductors into a semiconductor environment without sacrificing device performance due to substrate losses. One of these approaches has used the selective removing (by etching) of the silicon underneath the inductor (using methods of micro machining) thereby removing substrate parasitic effects. Another method has been to use multiple layers of metal (such as aluminum) interconnects or of copper damascene interconnects. Further applied has been using a high resistivity silicon substrate, thereby reducing resistive losses in the silicon substrate since resistive substrate losses form a dominant factor in determining the Q value of silicon inductors.

Biased wells have been proposed underneath a spiral conductor, this again aimed at reducing inductive losses in the surface of the substrate. A more complex approach has been to create an active inductive component that simulates the electrical properties of an inductor as it is applied in active circuitry. This latter approach however results in high power consumption by the inductor and in noise performance that is unacceptable for low power, high frequency applications. All of these approaches have as common objectives to enhance the quality (Q) value of the inductor, to increase the frequency of the LC self-resonance thereby increasing the frequency range over which the inductor can be used, and to reduce the surface area that is required for the creation of the inductor.

The inductor of the invention addresses the objectives that have been listed above and provides for a method of creating an inductor that significantly reduces capacitive coupling between the created inductor and the underlying silicon substrate. As previously indicated, in the creation of semiconductor devices such as CMOS device for the Giga-Hertz (GHz) frequency range, an on-chip inductor can be used in the creation of matching networks, passive filters, inductive loads, transformers and high-frequency oscillators. In order to achieve desired design objectives, past applications have been provided that make use of for instance higher conductivity metal layers in order to reduce the resistive loss of the inductor. Other applications have used multiple layers of metal for the inductor in this manner reducing the effective thickness of the spiral inductor and thereby reducing the resistive loss in the substrate during application at high frequency. Further has been proposed the use of a low-loss substrate or the use of a thick layer of dielectric such as oxide for the creation of the inductor over the surface thereof. All these provided applications however are not compatible with the conventional processing that is performed to create CMOS devices, resulting in relatively high processing costs incurred for the creation of the inductor. The invention addresses these concerns by providing a process for the creation of a suspended inductor, using the process that is part of conventional CMOS processing of opening bond pad window. This process removes layers of silicon nitride and silicon oxide from over the surface of the metal of the inductor after which the metal of the inductor is made to float in an air gap by wet-etching silicon oxide surrounding the metal of the inductor.

The invention will now be described using FIG. 1 through 7 for this purpose. First specifically referring to FIG. 1, there is shown a cross section of a silicon substrate 10 with a number of layers of semiconductor material created over the surface thereof. It must be recognized that these layers are conventional layers of semiconductor material that are typically used in the concurrent creation of CMOS devices over the surface of substrate 10. Layer 12 is first created over the surface of substrate 10 as a layer of pad oxide, that is conventionally created over the surface of a substrate for the creation of a CMOS gate electrode. Layer 12 of silicon dioxide is preferred to be about 0.4 µm thick. Over the surface of layer 12 is created a layer 14 of oxide based Intra Level Dielectric (ILD) or Inter Metal Dielectric (IMD) which again is a semiconductor material that is conventionally used for the creation of CMOS devices, for instance as a layer of ILD surrounding a gate electrode through which contact plugs are created for access to the surface of the drain/source regions of the gate electrode or to the gate electrode. As a final layer deposited in the cross section of FIG. 1 has been highlighted layer 16, comprising etch stop material, which also is a frequently applied layer of semiconductor material that for instance can be used for the creation of openings through a layer of ILD for the previously indicated contact plugs.

Figure 1:
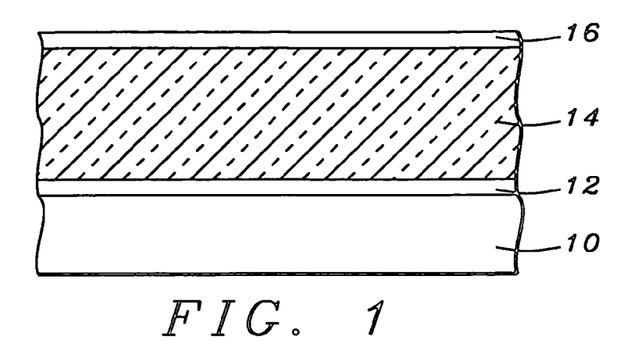
FIG. 1 shows the cross section of the surface of a substrate over which have successively been created a layer of pad oxide, a layer of dielectric and a layer of etch stop material.

A blanket layer 12 of pad oxide can be formed to a thickness of about 110 Angstrom through a thermal oxidation of the underlying silicon method at a temperature of about 920 degrees C. for a time period of about 480 minutes. A layer of field of gate oxide can also be formed in conjunction with a deposited oxide layer, nitride layer or any other material suitable for use as a gate dielectric.

The preferred material of the invention to be used for layer 14 of dielectric is silicon dioxide ($SiO_2$), created to a thickness not less than about 5.0 µm. Following discussions will highlight the reasons why this thickness is a preferred thickness. These reasons are essentially supported by considerations of separation between the created inductor and the substrate 10 and by considerations of inductor resistance. The preferred material of the invention for the creation of layer 16 of etch stop material is silicon nitride ($Si_3N_4$).

The layer 14 of silicon oxide layer can be deposited by PECVD whereby however other deposition means may alternatively be used to deposit this layer. However, PECVD is preferred because of the low deposition temperature. PECVD silicon oxide may be deposited at temperatures between 200 and 350 degrees C. for $SiH_4/O_2$ or $SiH_4/N_2O$ precursors.

The layer 16 of silicon nitride ($Si_3N_4$) can be deposited using LPCVD or PECVD procedures at a pressure between about 300 mTorr and 400 mTorr, at a temperature between about 600 and 800 degrees C., to a thickness of about between about 2000 and 3000 Angstrom but more preferably to a thickness of about 2500 Angstrom using $NH_3$ and $SiH_4$. The silicon nitride layer 16 can also be using $NH_3$ and $SiH_4$. The silicon nitride layer 16 can also be deposited using LPCVD or PECVD procedures using a reactant gas mixture such as dichlorosilane ($SiCl_2H_2$) and ammonia ($NH_3$).

Figure 2:
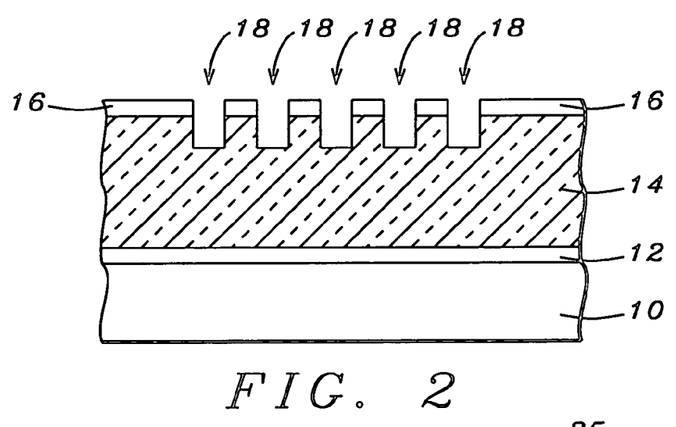
FIG. 2 shows a cross section after openings for the deposition of metal for the inductor have been created.

The invention now creates a pattern of openings 18 through layers 16 and into layer 14 for the formation of the spiral inductor. Openings 18 can be created using conventional methods of anisotropic etching of a layer of etch stop material and a layer of dielectric. For instance, layer 16 can be selectively removed by anisotropic RIE using $CHF_3$ or $SF_6$—$O_2$ as an etchant.

Figure 3:
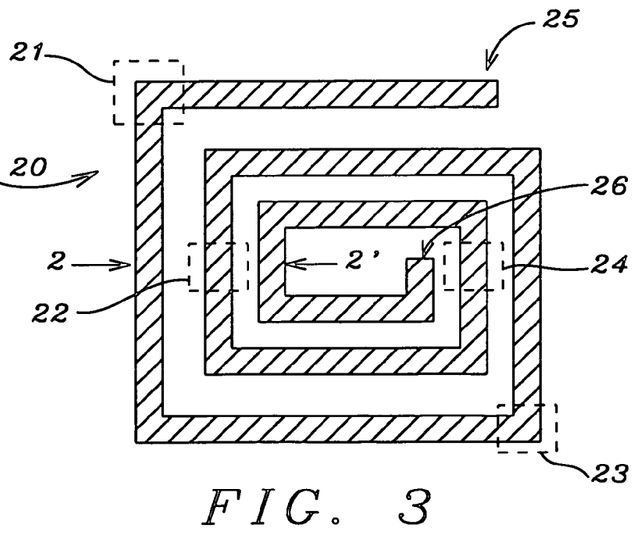
FIG. 3 shows a top view of the inductor of the invention whereby potentially provided supporting pillars are highlighted.

After the air gaps of openings 18 have been created, metal pillars are formed in support of a thereover to be created spiral inductor. To better view the openings that can be created in support of the spiral inductor, the top view of FIG. 3 has been created wherein, for spiral inductor 20, openings 21-24 have been created for the purpose of creating supporting pillars therein. It must be emphasized that the location of these supporting pillars that have been shown in the top vies of FIG. 3 are completely arbitrary and are shown here mainly for purposes of illustration. These pillars may be created as required for proper support of the spiral inductor 20, which further determines the number and the location of the supporting pillars.

As a second embodiment of the invention, it is emphasized that the presence of the supporting pillars 21-24 may, for some applications, be omitted. It must thereby be realized that the spiral inductor is interconnected to surrounding circuits and components, which requires that an interfacing connection is provided at entry point 25 and at exit point 26 of the inductor. These connections to points 25 and 26 of the spiral inductor 20 may provide adequate support for the inductor such that the inductor remains in place in a dependable and reliable manner. For these applications therefore no openings 21-24 and supporting pillars are required.

From the top view of FIG. 3 is further clear that line 2-2', shown in this top view, is a cross section of (three of) the openings 18 that have been shown in FIG. 2. In other words, the openings 18 that are shown in FIG. 2 represent only a partial cross section of the spiral inductor.

Figure 4:
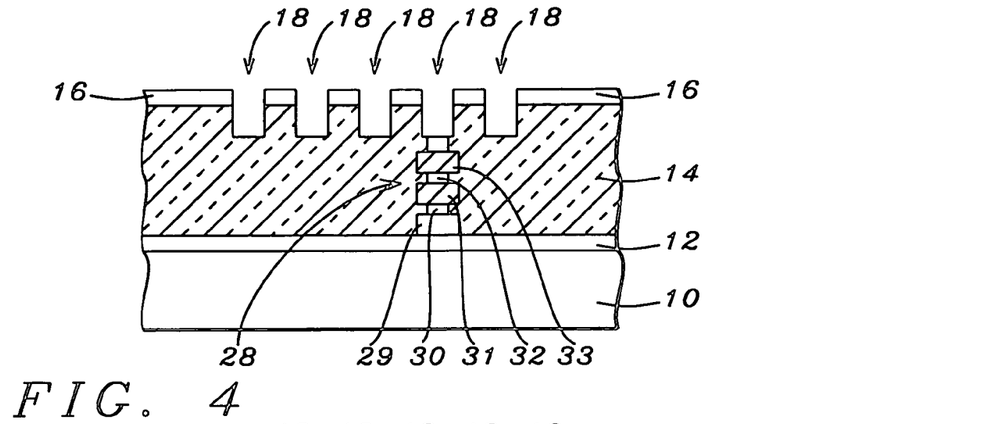
FIG. 4 shows a cross section of a supporting pillar of the inductor.

The openings 21-24 can further by created in multiple steps and being of unequal diameter for successive steps of opening creation. The purpose of the multiple steps and unequal diameters of the created openings is to create optimum support pillars for the spiral inductor. The openings further can be filled with selected semiconductor materials such as polysilicon and metal. The latter concepts are highlighted in the cross section that is shown in FIG. 4, where specifically one (28) of the created pillars is shown in cross section.

From the cross section of the created pillar 28 the following observations can be made:

The created pillar may comprise multiple layers of semiconductor material, here highlighted as layers 29-33

A lower layer 29 may be made of polysilicon in accordance with and simultaneously created with a patterned and etched layer of gate material such as polysilicon for the creation of a gate electrode Layers 31 and 33 may comprise a metal, such as contact pad material and may be created simultaneously with the creation of contact pads (not shown) as part of a semiconductor device, and Layers 30 and 32 may comprise a semiconductor material such as a dielectric, preferably comprising silicon nitride, applied during partial creation of pillar 28.

Figure 5:
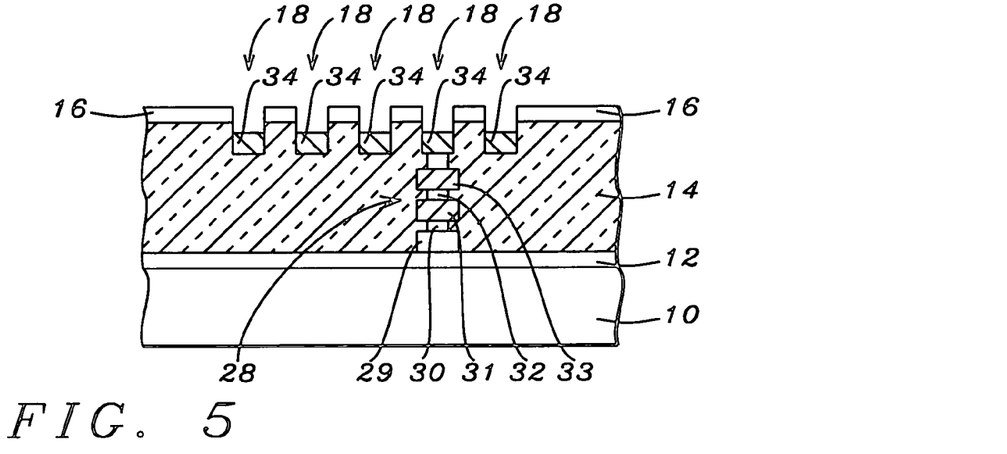
FIG. 5 shows a cross section after metal for the inductor has been deposited.

After openings 21-24 have been filled, creating supporting pillars penetrating and contained in openings 21-24, the invention now deposits the metal layer 34 for the spiral inductor using methods of metal sputtering of electroplating, as shown in cross section in FIG. 5. Layer 34 of spiral metal is preferably deposited to a thickness of about 1.2 μm using a TiW/Al-1% Si/TiW metallization process.

Figure 6:
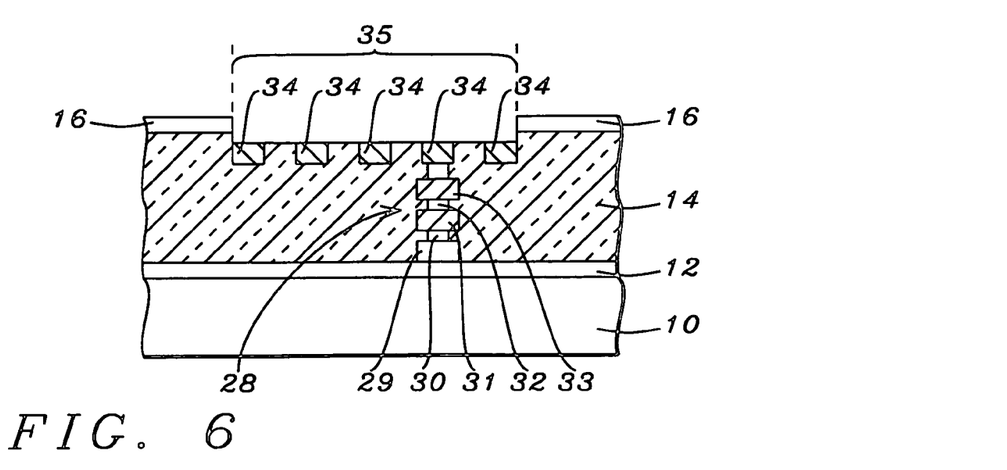
FIG. 6 shows a cross section after an opening has been etched overlying the inductor, exposing surface areas of the layer of dielectric surrounding the inductor.

The window of the spiral inductor, that is opening 35 shown in FIG. 6, is now opened by removing the layers of silicon nitride and silicon dioxide where these layers 16 and 14 are located above the plane that is formed by the top surfaces of metal layers 34 of the spiral inductor. This process is the same process as is conventionally used for the creation of an opening overlying a bond pad, the results of this opening of the window of the spiral inductor is shown in cross section in FIG. 6.

Figure 7:
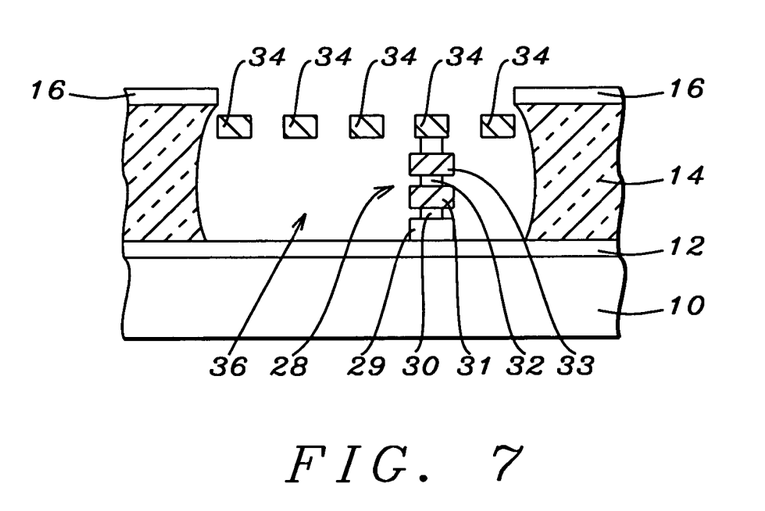
FIG. 7 shows a cross section after the dielectric surrounding the inductor has been etched, creating the suspended inductor of the invention.

The next step, of critical importance to the invention, is the creation of an air gap surrounding the inductor 34, using a slope etcher under conditions of applying, per liter of slope and contained therein: 107 ml of DIW, 509 ml of BOE diluted in the ratio of 10:1, 35 ml of 49% HF and 349 ml of CH$_3$OOH, applied at a temperature of 25 degrees C. and for the time of 1 minute.

The results of the exposing the structure shown in cross section in FIG. 6 to the indicated slope solution using the slope etcher are shown in cross section in FIG. 7, where significantly air gap 36 has been created surrounding the spiral inductor 34 and the therewith provided pillar 28. Since the slope etcher has extremely low etching rate of TiW and polysilicon and silicon nitride, the effect of the slope etcher on the patterns that have been created for the inductor and the supporting pillar(s) and that are exposed to the slope are minimal and can be neglected. Such patterns may, in addition to the pattern 34 and pillar 28 shown in cross section in FIG. 7, comprise metal bonding pads, polysilicon laser fuses and layers of passivation comprising silicon nitride.

The cross section that is shown in FIG. 7 essentially completes the creation of the spiral inductor of the invention. As typical dimensions for such an inductor can be cited:

an inner diameter of about 100 μm a width of the layers of metal of the inductor of about 10 μm a spacing between the layers of metal of the inductor of about 2 μm, and about 10 turns for the body of the spiral inductor.

Further specifics relating to the placement of the spiral inductor are:

a distance between the surface of layer 12 of field oxide and the bottom of the layers 34 of metal of the spiral inductor of about 3.4 μm the thickness of the layer 12 of field oxide of about 0.4 μm.

Using the above indicated parameters and creating in accordance therewith a spiral inductor over the surface of a silicon substrate having a resistivity of 2.5 ohm/cm, a measured inductance of 22.3 nH has been created.

Figure 8:
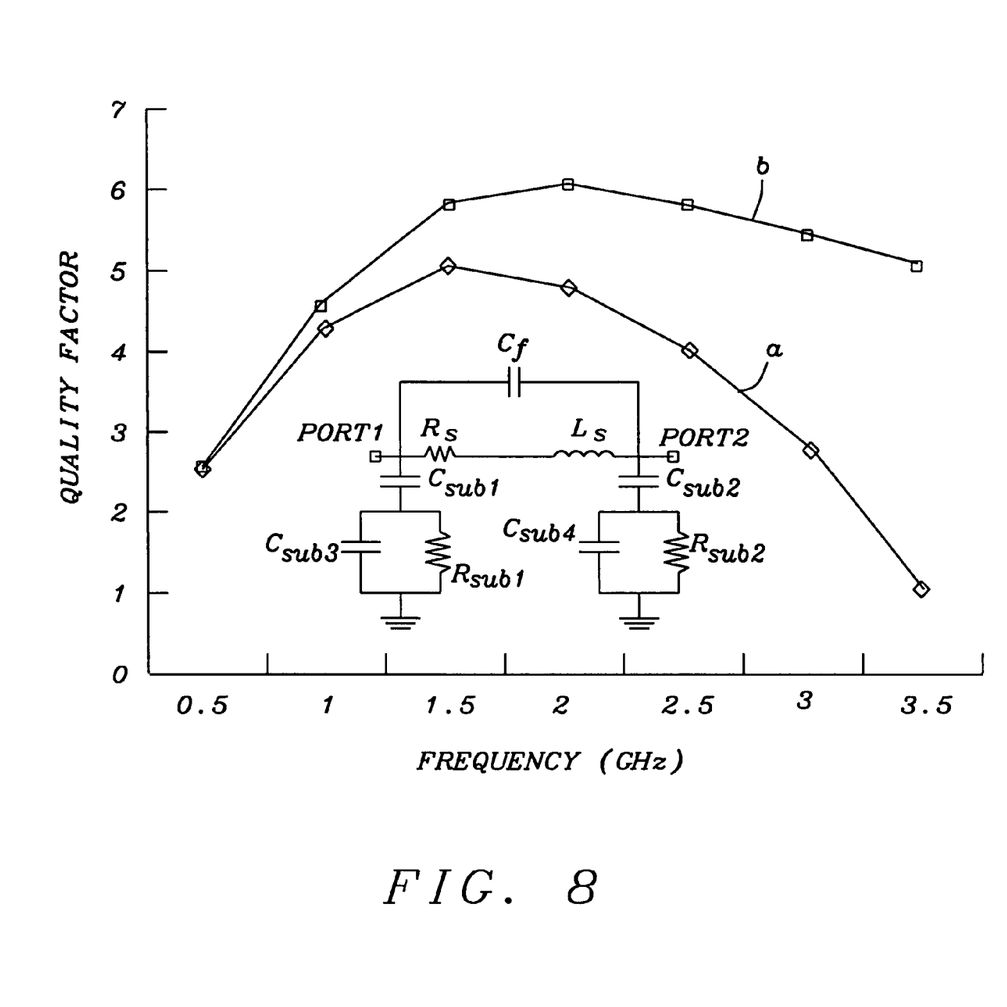
FIG. 8 shows measurement results of the Q-factor of a conventional inductor and of the inductor of the invention, as a function of frequency.

Using the frequently applied Ashby's lump inductor model, shown inserted in the graph of FIG. 8, it can be derived that the quality factor of an inductor can be enhanced by reducing the fringe parasitic capacitance $C_f$, FIG. 8, between the metal traces of the inductor and by reducing the capacitances $C_{sub1}$ and $C_{sub2}$ between the metal layer of the inductor and the substrate. The invention has applied this principle by creating an air gap surrounding the inductor as a replacement of the conventional layer of silicon dioxide, in this manner reducing the indicated capacitances. Since the effective dielectric constant of air is about one fourth (¼) of the dielectric constant of silicon dioxide, the capacitances of $C_f$ and $C_{sub1}$ and $C_{sub2}$ can be reduced by a factor of almost 75%.

Further shown in the graph of FIG. 8 are experimental results, which further confirm the above-indicated estimates. Curve "a" represents a conventionally created spiral inductor, using silicon dioxide as a surrounding medium, curve "b" represents the inductor of the invention using an air gap as surrounding medium. The measured maximum Q-factor of the conventionally created inductor and the maximum Q-factor of the inductor created by the invention are respectively 4.8 (at 1.5 GHz) and 6.3 (at 2.0 GHz). This can be interpreted as providing an almost 31% improvement in the magnitude of the Q-factor and an improvement of almost 33% in the frequency for the maximum Q-factor that can be obtained in this manner. These improvements singly and combined enhance the application of the inductor of the invention in RF integrated circuit devices.

In summary:

a new structure is provided for the creation of a spiral inductor the spiral inductor may be supported by spirals or may be suspended by entry and exit point connections the spiral inductor of the invention reduces the capacitance between the metal traces of the inductor in the plane of the traces the spiral inductor of the invention reduces the capacitance between the metal traces of the inductor and the underlying substrate the maximum Q-factor of the inductor can be improved from a conventional value of 4.8 at 1.5 GHz to a value of 6.3 at 2.0 GHz the inductor of the invention can more beneficially be applied to RF applications of semiconductor devices, and the creation of the inductor of the invention require processes that are part of conventional CMOS device creation processes and can therefore be implemented on a cost-effective basis.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a suspended inductor, comprising the steps of:

providing a substrate;

depositing a layer of dielectric over the surface of said substrate;

depositing a layer of etch stop material over the surface of said layer of dielectric;

patterning and etching said layer of etch stop material, thereby creating a pattern of said inductor through the layer of etch stop material;

etching said layer of dielectric to a measurable depth in accordance with said pattern created through said layer of etch stop material, creating a pattern for said inductor in said layer of dielectric;

filling said pattern created in said layer of dielectric with an inductor material to a measurable height;

exposing the surface area of said layer of dielectric; and etching the exposed surface area of said layer of dielectric, thereby creating an air gap in said layer of dielectric, said air gap contiguous with said inductor material.

2. The method of claim 1, said exposing surface areas of said layer of dielectric further comprising additional steps of:

removing said patterned and etched layer of etch stop material from the surface of said layer of dielectric where said layer of etch stop material aligns with said inductor and overlies a first plane formed by said first upper line of said first cross section of said spirals of said inductor, said first plane further being parallel with the surface of said substrate; and removing said layer of dielectric where said layer of dielectric aligns with said inductor and overlies said first plane.

3. The method of claim 1, additionally comprising a step of creating at least one supporting pillar for said inductor through said layer of dielectric, said additional step being performed prior to said filling said pattern created in said layer of dielectric with an inductor material to a measurable height.

4. The method of claim 1, said etching the exposed surface areas of said layer of dielectric comprising exposing said exposed surface areas of dielectric to an etchant, said etchant having a ratio between a rate of removal of said layer of dielectric and a rate of removal of said inductor material, thereby removing said exposed layer of dielectric by a measurable amount.

5. The method of claim 4, said etchant configured to create sidewalls with slope in the dielectric.

6. The method of claim 4, said etchant being used under conditions of applying, per liter of slope and contained therein: 107 ml of DIW, 509 ml of BOE diluted in the ratio of 10:1, 35 ml of 49% HF and 349 ml of $CH_3OOH$, applied at a temperature of 25 degrees C. and for the time of 1 minute.

7. The method of claim 3, said step of creating at least one supporting pillar comprising steps of creating patterned and etched overlying layers of semiconductor material, said patterned and etched overlying layers of semiconductor material underlying and being aligned with at least one element of said pattern of said inductor, said patterned and etched overlying layers of semiconductor material having an etch sensitivity when applying a first etchant thereto that is lower than the etch sensitivity of said layer of dielectric when applying said first etchant thereto by a measurable amount.

8. The method of claim 1, said layer of dielectric comprising silicon dioxide, created to a thickness not less than about 5.0 μm.

9. The method of claim 1, said inductor being a spiral inductor.

10. The method of claim 1, said measurable height being about 1.2 μm.

11. The method of claim 7, said patterned and etched overlying layers of semiconductor material comprising material selected from the group consisting of polysilicon, silicon nitride, metals, and dielectrics.

12. The method of claim 3, said step of creating at least one supporting pillar comprising steps of creating patterned and etched overlying layers of semiconductor material, said patterned and etched overlying layers of semiconductor material underlying and being aligned with at least one element of said pattern of said inductor, said patterned and etched overlying layers of semiconductor material having an etch sensitivity that is less than an etch sensitivity of an oxide based layer of dielectric by a measurable amount.

13. The method of claim 1, said layer of etch stop material comprising silicon nitride ($Si_3N_4$).

14. A method for the creation of a suspended inductor, comprising the steps of:

providing a substrate;

depositing a layer of dielectric over the surface of said substrate depositing a layer of etch stop material over the surface of said layer of dielectric;

creating a pattern of said inductor through the layer of etch stop material;

patterning said layer of dielectric in accordance with said pattern created through said layer of etch stop material, thereby creating a pattern for said inductor in said layer of dielectric;

filling said pattern created in said layer of dielectric with an inductor material; and patterning said layer of dielectric, thereby creating an air gap in said layer of dielectric, said air gap contiguous with said inductor material.

15. The method of claim 14, said patterning said layer of dielectric further comprising additional steps of:

removing said patterned and etched layer of etch stop material from the surface of said layer of dielectric where said layer of etch stop material aligns with said inductor and overlies a first plane formed by said first upper line of said first cross section of said inductor, said first plane further being parallel with the surface of said substrate; and removing said layer of dielectric where said layer of dielectric aligns with said inductor and overlies said first plane.

16. The method of claim 14, additionally comprising a step of creating at least one supporting pillar for said inductor through said layer of dielectric, said additional step being performed prior to said filling said pattern created in said layer of dielectric with an inductor material.

17. The method of claim 14, said patterning said layer of dielectric comprising exposing the surface area of said dielectric to an etchant, said etchant having a ratio between a rate of removal of said layer of dielectric and a rate of removal of said inductor material, thereby removing said layer of dielectric.

18. The method of claim 16, said step of creating at least one supporting pillar comprising steps of creating patterned overlying layers of semiconductor material, said patterned overlying layers of semiconductor material underlying and being aligned with at least one element of said pattern of said inductor, said patterned overlying layers of semiconductor material having an etch sensitivity when applying a first etchant thereto that is lower than the etch sensitivity of said layer of dielectric when applying said first etchant thereto.

* * * * *